(12) United States Patent
Shenai-Khatkhate et al.

(10) Patent No.: US 7,390,360 B2
(45) Date of Patent: Jun. 24, 2008

(54) ORGANOMETALLIC COMPOUNDS

(75) Inventors: Deodatta Vinayak Shenai-Khatkhate, Danvers, MA (US); Egbert Woelk, North Andover, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 252 days.

(21) Appl. No.: 11/237,999

(22) Filed: Sep. 28, 2005

(65) Prior Publication Data

US 2006/0115595 A1 Jun. 1, 2006

Related U.S. Application Data

(60) Provisional application No. 60/616,079, filed on Oct. 5, 2004.

(51) Int. Cl.
*C30B 25/00* (2006.01)

(52) U.S. Cl. .......................................... 117/84; 438/481

(58) Field of Classification Search ............... 117/1; 118/1; 556/1; 438/1; 257/1
See application file for complete search history.

(56) References Cited

U.S. PATENT DOCUMENTS

| 4,734,999 | A | 5/1988 | Fujisawa et al. | |
|---|---|---|---|---|
| 5,403,620 | A | 4/1995 | Kaesz et al. | |
| 6,271,104 | B1 * | 8/2001 | Razeghi et al. | 438/481 |
| 6,342,405 | B1 * | 1/2002 | Major et al. | 438/46 |
| 6,750,120 | B1 | 6/2004 | Kneissl et al. | |
| 2003/0111013 | A1 | 6/2003 | Oosterlaken et al. | |
| 2003/0181746 | A1 * | 9/2003 | Shenai-Khatkhate et al. | 556/42 |
| 2004/0197945 | A1 | 10/2004 | Woelk et al. | |

OTHER PUBLICATIONS

Begarney et al.; "Kinetics of carbon tetrachloride decomposition during the metalorganic vapor-phase epitaxy of gallium arsenide and indium arsenide"; Journal of Crystal Growth 193 (1998); pp. 305-315.

Fuji et al.; "Surface orientation dependency for AlGaAs growth rate with/without HCl in MOCVD"; Journal of Crystal Growth 259 (2003) pp. 357-334.
Lee et al.; "Vapor phase epitaxy of GaN using $GaCl_3/N_2$ and $NH_3/N_2$"; Journal of Crystal Growth 169 (1996) pp. 6898-696.
Namerikawa et al.; "Growth parameter dependence of HVPE GaN and polarity and crystal quality of the grown layers"; Journal of Crystal Growth 237-239 (2002); pp. 1089-1093.
Philippens et al.; "Conformal MOVPE of (Al)GaAs on silicon using alternative chlorine-containing precursors"; Journal of Crystal Growth 221 (2000); pp. 225-230.
Shiraishi et al.; "Selective-area metalorganic molecular beam epitaxy of GaAs using Metalorganic chloride gallium precursors"; Journal of Crystal Growth 182 (1997) pp. 255-265.
Takahashi et al.; "Atmospheric pressure vapor-phase growth of ZnO using a chloride source"; Journal of Crystal Growth 209 (2000) pp. 822-827.
Topf et al.; "Low-pressure chemical vapor deposition of GaN epitaxial films"; Journal of Crystal Growth 189/190 (1998) pp. 330-334.
Takahashi et al.; "Vapor-phase epitaxy of $InxGa1-xN$ using chloride sources"; Journal of Crystal Growth 189/190 (1998); pp. 37-41.
Zhang et al.; "Gallium nitride growth using diethyl gallium chloride as an alternative gallium source"; Journal of Crystal Growth 213 (2000) pp. 1-9.
Wang et al., "High-quality GaN nanowires synthesized using a CVD approach", Applied Physics A: Materials Science and Processing, vol. 75, Dec. 1, 2002, pp. 691-693.
Ishizaki et al., "Atomic Layer Epitaxy of Aias Using Dimethylaluminumhydride/Trimethyla Luminum Mixture as the Al Source", Japanese Journal of Applied Physics, Japan Society of Applied Physics, Tokyo, JP, vol. 30, No. 3B, Mar. 15, 1999, pp. L428-L430.
European Search Report of corresponding European Application No. 05 25 6207 mailed Aug. 11, 2006.

* cited by examiner

*Primary Examiner*—Robert Kunemund
*Assistant Examiner*—Marissa W. Chaet
(74) *Attorney, Agent, or Firm*—S. Matthew Cairns

(57) ABSTRACT

Compositions useful in the manufacture of compound semiconductors are provided. Methods of manufacturing compound semiconductors using these compositions are also provided.

9 Claims, No Drawings

ORGANOMETALLIC COMPOUNDS

This application claims the benefit of U.S. provisional application Ser. No. 60/616,079, filed on Oct. 5, 2004.

This invention relates generally to the field of organometallic compounds. In particular, this invention relates to organometallic compounds used in the manufacture of compound semiconductors.

Trialkyl Group IIIA metal compounds are used as precursors in the vapor deposition of Group IIIA metal-containing films. In the manufacture of III/V compound semiconductors, such as gallium nitride (GaN), using metalorganic chemical vapor deposition ("MOCVD") techniques, trimethyl gallium and ammonia (a Group V precursor) are conveyed in the vapor phase to a deposition chamber at elevated temperature, the compounds are decomposed and a film of GaN is deposited on a substrate heated at temperatures as high as 1000° C. or greater. In such process, a large amount of ammonia must be used as the incorporation of nitrogen in the film is inefficient in that only a small amount of ammonia is consumed. Usual quantity of ammonia used in the growth of Group III nitrides is several thousand folds molar excess of Group III organometallic employed. Highly pure ammonia, which is required in semiconductor manufacture, is quite expensive and ammonia can be difficult to handle in large amounts. Unreacted ammonia exits the deposition chamber as a waste stream and may enter the environment. Similar issues exist with the use of other Group V precursors such as phosphine such as used in the manufacture of InP and arsine such as used in the manufacture of GaAs.

Efforts have been made to improve these deposition processes. For example, hydrochloric acid has been used in conjunction with trimethyl gallium, trimethyl aluminum and arsine in the metalorganic chemical vapor deposition of $Al_xGa_{1-x}$As films, such as is disclosed in Fujii et al., *Surface Orientation Dependency for AlGaAs growth rate with/without HCl in MOCVD*, Journal of Crystal Growth, vol 259, pp 327-334, 2003. The presence of HCl produced complicated results, but the HCl was found to increase the amount of aluminum in the film. No effect on the amount of arsine employed was noted.

A problem in fabricating GaN-based microelectronic devices is the fabrication of GaN semiconductor layers having low defect densities. The substrate on which the gallium nitride layer is grown is a major contributor to defect density issue. Accordingly, although GaN layers have been grown on sapphire substrates, aluminum nitride buffer layers formed on silicon carbide substrates reduce defect density in GaN layers deposited thereon. Despite these advances, continued reduction in defect density is desirable and not yet fulfilled, since alternatives to sapphire substrates are very expensive.

Molecular beam epitaxy has been used to selectively grow GaAs films on a GaAs substrate using arsenic metal ($As_4$), triethyl gallium and either dimethyl gallium chloride or diethyl gallium chloride. The triethyl gallium and either dimethyl gallium chloride or diethyl gallium chloride were used in approximately equimolar amounts. This method achieved selective area epitaxial growth of the GaAs film on masked and patterned substrates, depositing polycrystalline GaAs only on the exposed GaAs substrate. This approach was not attempted with arsine, a gaseous Group VA compound.

There is a need for an improved method for manufacturing Group III/V semiconductors using thermal decomposition techniques, such as chemical vapor deposition ("CVD") and particularly MOCVD techniques. There remains a need to reduce the amount of hazardous Group VA compound sources used in the manufacture of III/V compound semiconductors with substantially reduced defect density, using CVD techniques.

The present invention addresses the above shortcomings by providing a method of depositing a film including a Group IIIA metal on a substrate including the steps of: a) conveying a Group IIIA metal compound having the formula $R_3M$, where M is a Group IIIA metal and each R is independently a ($C_1$-$C_{10}$) organic radical or hydrogen in a gaseous phase to a deposition chamber containing the substrate; b) conveying a catalytic amount of a catalyst compound in a gaseous phase to the deposition chamber containing the substrate; c) conveying a Group VA gaseous compound to the deposition chamber containing the substrate; d) decomposing the Group IIIA metal compound and the Group VA gaseous compound in the deposition chamber; and e) depositing the film comprising the Group IIIA metal on the substrate, wherein the catalyst compound catalyzes the decomposition of the Group VA gaseous compound. Preferably, the film deposited on the substrate contains a Group IIIA metal and a Group VA element, such as a III/V compound semiconductor.

Also provided by the present invention is a vapor delivery device including a vessel having an elongated cylindrical shaped portion having an inner surface having a cross-section, a top closure portion and a bottom closure portion, the vessel having an inlet opening for the introduction of a carrier gas and an outlet opening for the exiting of the carrier gas, the elongated cylindrical shaped portion having a chamber including a Group IIIA metal compound having the formula $R_3M$, where M is a Group IIIA metal and each R is independently a ($C_1$-$C_{10}$) organic radical or hydrogen and a catalyst compound capable of catalyzing decomposition of a Group VA gaseous compound; the inlet opening being in fluid communication with the chamber and the chamber being in fluid communication with the outlet opening. The catalyst compound is capable of catalyzing the decomposition of a Group VA gaseous compound.

As used throughout this specification, the following abbreviations shall have the following meanings, unless the context clearly indicates otherwise: ° C.=degrees centigrade; mol=moles; g=gram; ca.=approximately; mol %=mole percent; ppm=parts per million; μm=micrometer; Me=methyl; Et=ethyl; iPr=iso=propyl, iBu=iso-butyl; nPr=n-propyl; nBu=n-butyl; tBu=tert-butyl; Bz=benzene and Cp=cyclopentadienyl.

"Halogen" refers to fluorine, chlorine, bromine and iodine and "halo" refers to fluoro, chloro, bromo and iodo. "Alkyl" includes linear, branched and cyclic alkyl. Likewise, "alkenyl" and "alkynyl" include linear, branched and cyclic alkenyl and alkynyl, respectively. As used herein, "CVD" is intended to include all forms of chemical vapor deposition such as MOCVD, metalorganic vapor phase epitaxy ("MOVPE"), organometallic vapor phase epitaxy ("OMVPE"), organometallic chemical vapor deposition "(OMCVD") and remote plasma chemical vapor deposition ("RPCVD"). The articles "a" and "an" refer to the singular and the plural.

Unless otherwise noted, all amounts are percent by weight and all ratios are molar ratios. All numerical ranges are inclusive and combinable in any order except where it is clear that such numerical ranges are constrained to add up to 100%.

The present invention provides a method of depositing a film including a Group IIIA metal on a substrate including the steps of: a) conveying a Group IIIA metal compound having the formula $R_3M$, where M is a Group IIIA metal and each R is independently a ($C_1$-$C_{10}$) organic radical or hydrogen in a gaseous phase to a deposition chamber containing the substrate; b) conveying a catalytic amount of a catalyst compound in a gaseous phase to the deposition chamber containing the substrate; c) conveying a Group VA gaseous compound to the deposition chamber containing the substrate; d) decomposing the Group IIIA metal compound and the Group VA gaseous compound in the deposition chamber; and e) depositing the film comprising the Group IIIA metal on the substrate, wherein the catalyst catalyzes the decomposition of the Group VA gaseous compound.

A wide variety of Group IIIA metal compounds may be used in the present invention. In such compounds, the R groups may be the same or different, i.e. the compounds may be homoleptic or heteroleptic, respectively. Suitable groups for R include alkyl, alkenyl, alkynyl and aryl. The R groups may optionally be substituted with one or more dialkylamino groups of the formula NR'R", wherein R' and R" are independently a $(C_1-C_4)$alkyl. By "substituted", it is meant that one or more hydrogens of the organic radical are replaced with a dialkylamino group. Typically, R is a $(C_1-C_6)$alkyl group, optionally substituted with one or more dialkylamino groups. In one embodiment, the Group IIIA metal compound has the formula $R_3M$, wherein each R is independently a $(C_1-C_6)$ alkyl and M is chosen from indium, gallium and aluminum. Exemplary R groups include, without limitation, methyl, ethyl, n-propyl, iso-propyl, n-butyl, iso-butyl, tert-butyl, iso-pentyl, neo-pentyl, allyl, vinyl and phenyl.

Exemplary Group IIIA metal compounds include, but are not limited to, trimethyl indium, triethyl indium, tri-n-propyl indium, tri-iso-propyl indium, dimethyl iso-propyl indium, dimethyl ethyl indium, dimethyl tert-butyl indium, methyl di-tert-butyl indium, methyl di-isopropyl indium, allyl dimethyl indium, methyl diallyl indium, trimethyl gallium, triethyl gallium, tri-iso-propyl gallium, tri-tert-butyl gallium, dimethyl iso-propyl gallium, diethyl tert-butyl gallium, allyl dimethyl gallium, methyl di-iso-propyl gallium, dimethyl tert-butyl gallium, dimethyl neo-pentyl gallium, methyl ethyl isopropyl gallium, trimethyl aluminum, triethyl aluminum, tri-n-propyl aluminum, tri-iso-propyl aluminum, tri-tert-butyl aluminum, dimethyl iso-propyl aluminum, dimethyl ethyl aluminum, dimethyl tert-butyl aluminum, methyl di-tert-butyl aluminum, methyl di-iso-propyl aluminum, allyl dimethyl aluminum, and methyl diallyl aluminum.

The Group IIIA metal compounds of the invention are generally commercially available or may be prepared by methods described in the art, see e.g., U.S. Pat. Nos. 5,756,786, 6,680,397 and 6,770,769. Such compounds may be used as is or may be further purified prior to use.

Suitable catalyst compounds are any compounds that catalyze the decomposition of a Group VA gaseous compound, which in turn suitably enhances the incorporation of a Group VA element in a III/V compound semiconductor film, particularly using techniques of thermal decomposition of vapor phase compounds. While not wishing to be bound by theory, it is believed that the catalyst compound will also reduce the mole ratio of Group VA element to Group IIIA metal compounds in the vapor phase necessary to prepare III/V compound semiconductor films. Exemplary catalyst compounds include, but are not limited to, compounds including one or more of a Group IIIA metal, a Group VA element or both. In one embodiment, the catalyst compound is a compound of the formula $R^1{}_aMY_b$, wherein M is a Group IIIA metal, each $R^1$ is independently chosen from $(C_1-C_{10})$ organic radical and hydrogen, each Y is independently chosen from halogen and hydrogen, a is an integer from 0 to 2, b is an integer from 1-3, and a+b=3. Such compounds typically contain 1-3 halogens, such halogens may be the same or different. In another embodiment, $R^1$ is a typically a $(C_1-C_6)$ alkyl.

Group VA element-containing compounds useful as a catalyst compound may include one or more elements chosen from nitrogen, phosphorus, arsenic, antimony and bismuth. In one embodiment, the catalyst compound includes one or more elements chosen from nitrogen, phosphorus and arsenic. Such catalyst compounds include, without limitation, primary amines, secondary amines, tertiary amines, primary phosphines, secondary phosphines, tertiary phosphines, primary arsines, secondary arsines, tertiary arsines, primary stibines, secondary stibines, tertiary stibines, primary bismuthines, secondary bismuthines and tertiary bismuthines.

Exemplary catalyst compounds include, without limitation, indium trichloride, methyl indium dichloride, dimethyl indium chloride, tert-butyl indium dichloride, indium tribromide, methyl indium dibromide, ethyl indium dibromide, iso-propyl indium dibromide, gallium trichloride, methyl gallium dichloride, ethyl gallium dichloride, gallium tribromide, methyl gallium dibromide, iso-propyl gallium dichloride, aluminum trichloride, methyl aluminum dichloride, dimethyl aluminum chloride, ethyl aluminum dichloride, aluminum tribromide, methyl aluminum dibromide, aluminum triflouride, hydrazine, unsymmertrical dimethyl hydrazine, phenyl hydrazine, isobutyl hydrazine, di-isopropyl amine, hydrazoic acid, phosphorus trichloride, methyl phosphorus dichloride, phenyl phosphorus dichloride, phosphorus tribromide, methyl phosphorus dibromide, tertiarybutyl phosphine, bis-phosphinoethane, arsenic trichloride, methyl arsenic dichloride, methyl arsenic dibromide, ethyl arsenic dichloride, propyl arsenic dibromide, monoethyl arsine, diethyl arsine, tertiarybutyl arsine, methyl antimony dichloride, ethyl antimony dichloride, antimony tribromide, methyl antimony dibromide, diethyl beryllium, triethyl boron, n-butyl lithium, bis(n-butyl) magnesium, bis(cyclopentadienyl) magnesium, tris(dimethylamino) gallium, bis(ethylcyclopentadienyl) nickel, tetrakis(diethylamino) molybdenum, pentakis(dimethylamino) tantalum, tetrakis(ethylmethylamino) zirconium and titanium tetrachloride.

In one embodiment, a Group IIIA metal-containing catalyst compound has the same metal as that used in the Group IIIA metal compound. In another embodiment, a catalyst compound including a Group VA element contains nitrogen when ammonia is used, phosphorus when phosphine is used and arsenic when arsine is used in the reaction. In yet another embodiment, the use of catalyst compounds containing different isoelectronic elements from the Group IIIA metal or from the gas (ammonia, phosphine or arsine) used offers certain advantages. As an example, but not wishing to be bound by any theory, the use of catalyst compounds containing isoeletronic elements different from those used to grow the desired film may enable modulation of the bandgap energy during film growth by modifying the surface reconstruction process and/or improving incorporation efficiency.

In general, the catalyst compound is present in a catalytic amount, which is an amount of ≦5 mol %, based on the moles of Group IIIA metal compound. Typically, the catalyst compound is present in an amount of ≦4 mol % and more typically ≦3 mol %. While any amount of catalyst compound is expected to provide the benefits of the invention, a minimum of an amount greater than the typical level of impurities in the Group IIIA metal compound is typically used, although lesser amounts may also be useful. For example, the catalytic amount of the catalyst is at least 5 ppm, more typically at least 10 ppm and still more typically at least 20 ppm, based on the weight of Group IIIA metal compound. A useful range of catalyst compounds is from 5 ppm to 5 mol %, and more typically 10 ppm to 5 mol %.

The catalyst compounds are generally commercially available or may be prepared by methods which are well-known in the art. Such compounds may be used as is or may be further purified prior to use.

A variety of Group VA gaseous compounds may be suitably employed in the present invention. Exemplary Group VA gaseous compounds include, but are not limited to ammonia, phosphine and arsine, which are generally commercially available and may be used as is or may be further purified.

In chemical vapor deposition processes, the Group IIIA metal compound, the catalyst compound and the Group VA gaseous compound are conveyed to a deposition chamber (reactor) in the gas phase. Once in the reactor, the compounds thermally dissociate and a desired film is deposited on a substrate.

The Group IIIA metal compounds and the catalyst compounds may be solids, liquids or gases. When the Group IIIA metal compounds and the catalyst compounds are solids, liquids or gases, they may be combined into a single delivery device, such as a bubbler. For example, two or more gases, two or more liquids, two or more solids, or a combination of liquid and solid compounds may be combined into a single delivery device. Alternatively, multiple delivery devices may be used. For example, a Group IIIA metal compound may be added to a first delivery device and a catalyst compound may be added to a second delivery device. When a gaseous catalyst compound is to be used with a solid and/or liquid Group IIIA metal compounds it is preferred that the gaseous catalyst compound is not in the same delivery device as the solid and/or liquid Group IIIA metal compound.

In one embodiment, films including a Group IIIA metal and a Group VA element are deposited by first placing a desired Group IIIA metal compound, i.e. source compound, and a catalyst compound in a vapor delivery device having an outlet connected to a deposition chamber. The present invention provides a composition including a Group IIIA metal compound having the formula $R_3M$, where M is a Group IIIA metal and each R is independently a ($C_1$-$C_{10}$) organic radical or hydrogen and a catalyst compound including one or more Group VA elements. In such composition, the Group VA element may be used in the catalyst compound. In particular, the catalyst compound may include one or more of nitrogen, phosphorus and arsine. The catalyst compound is typically present in the compositions in an amount of from 5 ppm to 5 mol %, based on the Group IIIA metal compound.

In another embodiment, a Group IIIA metal compound may be placed in a first vapor delivery device and a catalyst compound may be placed in a second vapor delivery device. Each vapor delivery device is then connected to the same deposition apparatus. Each of the compounds is then conveyed from its respective delivery device into the deposition chamber to provide the Group IIIA metal compound and the catalyst compound in the vapor phase. It will be appreciated that more than one vapor delivery device containing Group IIIA metal compounds may be used in order to provide more than one Group IIIA metal compounds in the vapor phase. In an alternate embodiment, two Group IIIA metal compounds are placed in a single delivery device.

Alternatively, when the catalyst compound is a gas, it may be placed in the same delivery device as the Group VA gaseous compound. In yet another embodiment, each of the Group IIIA metal compound, the catalyst compound and the Group VA gaseous compound may be placed in a separate delivery device.

A wide variety of vapor delivery devices may be used, depending upon the particular deposition apparatus used. When the precursor compound mixture is a solid, the devices disclosed in U.S. Pat. No. 6,444,038 (Rangarajan et al.) and U.S. Pat. No. 6,607,785 (Timmons et al.), as well as other designs, may be used. For liquid precursor compound mixtures, the devices disclosed in U.S. Pat. No. 4,506,815 (Melas et al) and U.S. Pat. No. 5,755,885 (Mikoshiba et al) may be used, as well as other liquid precursor vapor delivery devices. The source compound is maintained in the vapor delivery device as a liquid or solid. Solid source compounds are typically vaporized or sublimed prior to transportation to the deposition chamber.

The present invention further provides a vapor delivery device including a vessel having an elongated cylindrical shaped portion having an inner surface having a cross-section, a top closure portion and a bottom closure portion, the vessel having an inlet opening for the introduction of a carrier gas and an outlet opening for the exiting of the carrier gas, the elongated cylindrical shaped portion having a chamber including a Group IIIA metal compound having the formula $R_3M$, where M is a Group IIIA metal and each R is independently a ($C_1$-$C_{10}$) organic radical or hydrogen and a catalyst compound, the catalyst compound being capable of catalyzing the decomposition of a Group VA gaseous compound; the inlet opening being in fluid communication with the chamber and the chamber being in fluid communication with the outlet opening. In one embodiment, the top closure portion contains the inlet opening. In another embodiment, the top closure portion contains the inlet opening and the outlet opening.

In another embodiment, the present invention provides an apparatus for chemical vapor deposition of III/V compound semiconductor films including one or more of the vapor delivery devices for feeding a fluid stream saturated with the Group IIIA metal compound and the catalyst compound described above. Such vapor delivery devices may be used to provide the Group IIIA metal compound and the catalyst compound in the vapor phase to a single deposition chamber or to a plurality of deposition chambers.

Group VA gaseous compounds, such as ammonia, phosphine and arsine, are provided in appropriate delivery devices. Such delivery devices are well-known in the art. These gases are transported to the deposition chamber using conventional techniques.

The source compound and catalyst compound are typically transported to the deposition chamber by passing a carrier gas through the vapor delivery device. Suitable carrier gases include nitrogen, hydrogen, and mixtures thereof. In general, the carrier gas is introduced above or below the surface of a compound, and passes through the compound either to the headspace above it or a chamber below it, entraining or carrying vapor of the compound in the carrier gas. The entrained or carried vapor then passes into the deposition chamber. When the source compound and catalyst compound are in the same delivery device, the carrier gas entrains the vapor of both the source compound and the catalyst compound.

The deposition chamber is typically a heated vessel within which is disposed at least one, and possibly many, substrates. The deposition chamber has an outlet, which is typically connected to a vacuum pump in order to draw by-products out of the chamber and to provide a reduced pressure where that is appropriate. MOCVD can be conducted at atmospheric or reduced pressure. The deposition chamber is maintained at a temperature sufficiently high to induce decomposition of the source compound. The deposition chamber temperature is from 200° to 1200° C., the exact temperature selected being optimized to provide efficient deposition. Optionally, the temperature in the deposition chamber as a whole can be reduced if the substrate is maintained at an elevated temperature, or if other energy such as radio frequency ("RF") energy is generated by an RF source.

Suitable substrates for deposition, in the case of electronic device manufacture, include, without limitation, silicon, gallium-arsenide, indium-phosphide, sapphire, silicon-germanium, and strained silicon. Such substrates are particularly useful in the manufacture of integrated circuits.

Deposition is continued for as long as desired to produce a film including III/V compound semiconductor having desired properties. Typically, the film thickness will be from several tens of nanometers to several hundreds of micrometers.

Exemplary III/V compound semiconductor films grown according to the present invention include, but are not limited to, gallium-arsenide, aluminum-gallium-arsenide, indium-phosphide, indium-gallium-arsenide, indium-gallium-aluminum-phosphide, indium-gallium-arsenide-phosphide, indium-gallium-arsenide/gallium-arsenide/aluminum-gallium-arsenide, gallium-nitride, indium-gallium-nitride, indium-arsenide, and indium-arsenide-bismuthide. Such films are useful in the manufacture of electronic and optical (including optoelectronic) devices.

An advantage of the present invention is that the catalyst compounds may also function as a cleaner for CVD reactors, thus reducing reactor maintenance and reactor downtime. This is particularly the case where the catalyst compounds contain a halogen. Also, the use of present catalyst compound with the Group IIIA metal compound may lead to III/V semiconductors having better modulated/ordered surface and bandgap energy, enhanced incorporation of alloying elements and dopants, better surface morphology as a result of defect removal, and improved film flexibility as compared to III/V semiconductors made using conventional techniques. A further advantage is that the molar ratio of V/III precursor compounds used in the manufacture of III/V semiconductors is reduced when the present catalyst compounds are used. For example, the molar ratio of ammonia (V) to gallium precursor (III) in conventional GaN film deposition is approximately 3000:1. Such ratio can be reduced according to the present invention, such as by $\geq 10\%$, $\geq 20\%$, $\geq 30\%$, or even more. Additionally, the present catalyst compounds may also function as oxygen scavengers, thereby reducing oxygen contamination during III/V compound semiconductor film growth.

The following examples are expected to illustrate further various aspects of the present invention. All manipulations are performed in an inert atmosphere, typically under an atmosphere of dry nitrogen.

EXAMPLE 1

Deposition of an undoped GaN layer is carried out in a suitable cold-wall, vertical, and inductively heated MOCVD reactor operating at atmospheric pressure and dedicated to the GaN deposition. A thin GaN layer having a thickness of 2 μm is deposited, by standard MOCVD technique at 1050 to 1080° C. on a (0001) sapphire substrate having a thickness of 200 μm. The sapphire substrate is chemically treated beforehand by degreasing and pickling in an $H_2SO_4:H_3PO_4$ (3:1 ratio) acid solution. The gallium source is trimethylgallium (TMG) mixed with catalytic amounts of gallium trichloride (0.5 mol % based on 1 mole of TMG) as the catalyst compound. Ammonia gas is used as the nitrogen source. The carrier gas diluent, a 50:50 mixture of nitrogen and hydrogen, is used at flow rate of approximately 1.5 to 3 L/min. The gallium/catalyst source is placed in a bubbler, and is used at the rate of 10 to 15 μmoles/min of total gallium in conjunction with hydrogen bubbled through the bubbler. The ammonia is introduced via a separate line at the flow rate of 1 to 2 L/min. The reactants are allowed to decompose on heated sapphire substrate at 1060° C. After the deposition of the GaN layer is completed, the layer is annealed at a temperature of approximately 1080° C. GaN layers thus obtained are expected to have a reduced defect density (such as $10^8$ per $cm^2$). The reactor is expected to have significantly reduced deposition of polycrystalline, amorphous gallium containing deposits compared to those obtained in conventional uncatalyzed GaN growth.

EXAMPLE 2

Deposition of an undoped GaN layer is carried out according to the general procedure in Example 1, using trimethylgallium (TMG) intentionally mixed with catalytic amounts of unsymmetrical dimethylhydrazine (0.25% moles per mole of TMG) as the gallium source, and under identical conditions. GaN layers thus obtained are expected to have a reduced defect density (of approximately $10^8$ per $cm^2$) as compared to GaN layers produced using conventional methods. The reactor is expected to have significantly reduced deposition of polycrystalline, amorphous gallium containing deposits.

EXAMPLE 3

Deposition of an undoped AlN Layer is carried out according to the general procedure in Example 1, using trimethylaluminum (TMA) intentionally mixed with catalytic amounts of tertiarybutylphosphine (0.75% moles per mole of TMA) as the aluminum source, and under identical growth conditions. AlN layers thus obtained are expected to have a reduced defect density as compared to AlN layers produced using conventional methods. The reactor is expected to have significantly reduced deposition of polycrystalline, amorphous aluminum containing deposits.

EXAMPLE 4

Deposition of an undoped AlInGaN layer is carried out according to the general procedure in Example 1, using the organometallic sources as follows: trimethylaluminum (TMA) intentionally mixed with catalytic amounts of tertiarybutylamine (0.45% moles per mole of TMA) as the aluminum source, trimethylgallium (TMG) intentionally mixed with catalytic amounts of tertiarybutylphosphine (0.35% moles per mole of TMG) as the gallium source, trimethylindium (TMI) intentionally mixed with catalytic amounts of dimethylindium chloride (0.15% moles per mole of TMI) as the indium source and under identical growth conditions. AlInGaN layers thus obtained are expected to have a reduced defect density as compared to AlInGaN layers produced using conventional methods. The reactor is expected to have significantly reduced deposition of polycrystalline, amorphous aluminum containing deposits.

EXAMPLE 5

Example 1 is repeated except that a a magnesium-doped, p-type GaN layer is expected. Bis(cyclopentadienyl)magnesium is provided in a bubbler and is used as a dopant. Identical conditions are used to those of Example 1, and suitable flow rates of magnesium dopant are used at around 0.2 μmol/min. The reactants are allowed to decompose on heated sapphire substrate at 1060° C. After the deposition of the GaN layer is completed, the layer is annealed at a temperature of approximately 1080° C. GaN layers thus obtained are expected to have a reduced defect density (of approximately $10^8$ per $cm^2$) as compared to GaN layers produced using conventional methods. The dopant incorporation is expected to be increased by 50% relative to conventional GaN growth without the use of the present catalyst compound. The reactor is expected to have significantly reduced deposition of polycrystalline, amorphous gallium containing deposits.

EXAMPLE 6

The procedure of Example 1 is repeated except that the following reactants and conditions are used along with appropriate standard MOCVD film growth techniques. In each sample, appropriate substrates are used, for example, sapphire for Sample 6A, gallium arsenide for Samples 6B and 6C, and indium phosphide for Samples 6J-6K. The carrier gas in Sample A is $H_2/N_2$. For all other samples, $H_2$ is used as the carrier gas.

| Sample | Semiconducting Film | Group III Source (s) + (Catalyst) | Group V Source (s) + (Catalyst) | Expected Growth Temperature (° C.) |
|---|---|---|---|---|
| 6A | GaN | $Et_3Ga + (Et_2GaBr)$ | $NH_3$ | 1050 |
| 6B | GaAs | $Me_3Ga + (Me_2N\text{—}NH_2)$ | $AsH_3$ | 650 |
| 6C | GaAs | $Me_3Ga + (Et_2GaCl)$ | $AsH_3$ | 700 |
| 6D | GaSb | $Me_3Ga + (MeSbBr_2)$ | $Me_3Sb$ | 620 |
| 6E | GaSb | $Et_3Ga$ | $Me_3Sb + (MeSbBr_2)$ | 620 |
| 6F | GaAsSb | $Me_3Ga + (MeGaCl_2)$ | $Me_3Sb + AsH_3$ | 600 |
| 6G | GaAsP | $Me_3Ga + (tBuPCl_2)$ | $PH_3 + AsH_3$ | 650 |
| 6H | AlGaAs | $Me_3Al + Me_3Ga + (AsCl_3)$ | $AsH_3$ | 725 |
| 6I | InAs | $Me_3In + (InCl_3)$ | $AsH_3$ | 600 |
| 6J | InP | $Me_3In + (MeInBr_2)$ | $tBuPH_2$ | 600 |
| 6K | InP | $Me_3In + (tBuPH_2) + (AsMe_3)$ | $PH_3$ | 650 |
| 6L | LnSb | $Me_3In$ | $tBuSbMe_2 + (Me_2SbCl)$ | 425 |
| 6M | GaInP | $Me_3Ga + Me_3In + (Et_2GaCl)$ | $PH_3$ | 625 |
| 6N | AlInGaP | $Me_3Al + Me_3Ga + Me_3In + (Me_2AlCl)$ | $PH_3$ | 700 |
| 6O | GaInAs | $Me_3Ga + Me_3In + (EtAsH_2)$ | $AsH_3$ | 600 |
| 6P | AlAs | $Me_3Al + (Me_3N\text{—}AlH_3)$ | $AsH_3$ | 725 |
| 6Q | GaN | $(Me_3Ga + RuCp_2)$ | $NH_3$ | 1050 |
| 6R | AlGaN | $(Me_3Ga + Mo(EtBz)_2) + Me_3Al$ | $NH_3$ | 1025 |
| 6S | AlInGaP | $Me_3Al + iPr_2MeIn + (Et_3Ga + CoCp_2)$ | $tBuPH_2$ | 700 |

EXAMPLE 7

The procedure of Example 6 is repeated except that the following reactants and conditions are used along with appropriate standard MOCVD film growth techniques. In each sample, appropriate substrates are used, for example, sapphire for gallium nitride films, gallium arsenide for gallium arsenide films, and indium phosphide for indium-containing films. $H_2$ is used as the carrier gas. The catalyst is present in an amount of at least 5 ppm.

| Sample | Catalyst (mol %) | Group IIIA compound/ Group VA compound | Semiconducting Film | Expected Growth Temperature (° C.) |
|---|---|---|---|---|
| 7A | $Al(iBu)_3$ (<2) | $TMG/AsH_3$ | GaAs | 650 |
| 7B | $Al(NMe_2)_3$ (<3) | $TMG/NH_3$ | GaN | 1050 |
| 7C | $AlH_3\text{—}NMe_3$ (<1) | TEG/DMHy | GaN | 1040 |
| 7D | MPA (<2) | $TMG/NH_3$ | GaN | 1010 |
| 7E | $Sb(NMe_2)_3$ (<2) | $TMG/PH_3$ | GaP | 650 |
| 7F | $Sb(iPr)_3$ (<1) | $TMA/EDMIn/TMG/PH_3$ | AlInGaP | 700 |
| 7G | $tBuAsH_2$ (<3) | $TEAl/TMG/AsH_3$ | AlGaAs | 720 |
| 7H | $AsMe_3$ (<4) | $TMI/AsH_3$ | InAs | 600 |
| 7I | $As(NMe_2)_3$ <3 | TMG/MEAs | GaAs | 650 |
| 7J | $BEt_3$ (<2) | TMI/BPE | InP | 600 |
| 7K | $B(NMe_2)_3$ (<3) | $TMG/AsH_3/PH_3$ | GaAsP | 700 |
| 7L | $B_2(NMe_2)_4$ (<1) | TMA/TMG/TMSb | AlGaSb | 600 |
| 7M | $Ba(nPrMe_4Cp)_2$ (<1) | $TMG/PH_3/TESb$ | GaPSb | 625 |
| 7N | $BeEt_2$ (<2) | TMI/TMG/TIPSb | InGaSb | 620 |
| 7O | $Be(NMe_2)_2$ (<0.25) | $TEG/AsH_3/TMSb$ | GaAsSb | 600 |
| 7P | $BiMe_3$ (<2) | $TMA/TEIn/TMG/PH_3$ | AlInGaP | 650 |
| 7Q | $Ca(MesCp)_2$ (<0.5) | $TMA/TMG/AsH_3$ | AlGaAs | 725 |
| 7R | $CoCp_2$ (<1) | DIPMeIn/TBA | InAs | 600 |
| 7S | $Cu(TMHD)_2$ (<0.5) | TEIn/TBP | InP | 600 |
| 7T | $CrCp_2$ (<1) | TMA/TMI/MIPAs | AlInAs | 620 |
| 7U | $Cr(NEt_2)_4$ (<2) | TIPIn/TBP | InP | 600 |

-continued

| Sample | Catalyst (mol %) | Group IIIA compound/ Group VA compound | Semiconducting Film | Expected Growth Temperature (° C.) |
|---|---|---|---|---|
| 7V | ErCp$_3$ (<0.5) | TMG/NH$_3$ | GaN | 1050 |
| 7W | FeCp$_2$ (<0.25) | TMA/TEG/NH$_3$ | AlGaN | 1020 |
| 7X | GaEt$_3$ (<2) | TMA/DIPMeIn/PH$_3$ | AlInP | 625 |
| 7Y | Ga(NMe$_2$)$_3$ <3) | TEG/NH$_3$ | GaN | 1050 |
| 7Z | Me$_2$Au(acac) (<1) | TMA/TMI/TEG/BPE | AlInGaP | 650 |
| 7AA | Hf(NMe$_2$)$_4$ <1) | DIPMeIn/TESb | InSb | 425 |
| 7BB | InCp (<3) | TMA/TMG/DMHy | AlGaN | 1040 |
| 7CC | In(MesCp) (<2) | TEAl/TEIn/TEG/PH$_3$ | AlInGaP | 700 |
| 7DD | LaCp$_3$ (<1) | TEG/NH$_3$ | GaN | 1050 |
| 7EE | nBuLi (<0.5) | TEG/TMSb | GaSb | 620 |
| 7FF | Mg(nBu)$_2$ (<0.25) | TMG/TMI/AsH$_3$ | GaInAs | 600 |
| 7GG | MgCp$_2$ (<0.5) | TEAl/AsH$_3$ | AlAs | 725 |
| 7HH | MnCp$_2$ (<0.5) | TMG/NH$_3$ | GaN | 1050 |
| 7II | Mo(EtBz)$_2$ (<1) | TEG/DMHy | GaN | 1020 |
| 7JJ | MoCp$_2$ (<1.5) | TMG/AsH$_3$ | GaAs | 650 |
| 7KK | Mo(NEt$_2$)$_4$ <1) | TMA/TEG/AsH$_3$ | AlGaAs | 700 |
| 7LL | tBuNH$_2$ (<3) | TMI/TEG/NH$_3$ | InGaN | 1010 |
| 7MM | Me$_2$N—NH$_2$ (<2) | TMA/TMI/TEG/NH$_3$ | AlInGaN | 950 |
| 7NN | Ni(PF$_3$)$_4$ <1) | TEG/TIPSb | GaSb | 620 |
| 7OO | Ni(EtCp)$_2$ (<0.75) | TMA/TMI/AsH$_3$ | AlInAs | 625 |
| 7PP | OsCp$_2$ (<1) | TEG/NH$_3$ | GaN | 1025 |
| 7QQ | Me$_3$Pd(MeCp) (<1) | TMA/TMI/TEG/PH$_3$ | AlInGaP | 700 |
| 7RR | P(NMe$_2$)$_3$ <3) | TEG/TESb/TBP | GaSbP | 620 |
| 7SS | PEt$_3$ (<3) | TMA/TEG/PH$_3$ | AlGaP | 700 |
| 7TT | tBuPH$_2$ (<3) | TMG/NH$_3$ | GaN | 1040 |
| 7UU | Me$_3$Pt(MeCp) (<1) | TEG/AsH$_3$/NH$_3$ | GaAsN | 950 |
| 7VV | Rh(acac)$_3$ <0.75) | DIPMeIn/TEG/NH$_3$ | InGaN | 950 |
| 7WW | RuCp$_2$ (<1) | TMG/NH$_3$ | GaN | 1050 |
| 7XX | (hfacac)Ag-VTES (<0.5) | TMA/TMG/AsH$_3$ | AlGaAs | 725 |
| 7YY | Sr(nPrMe$_4$Cp)$_2$ (<0.25) | TMI/MEAs | InAs | 600 |
| 7ZZ | Sr(hfacac) (<0.5) | TMI/PH$_3$ | InP | 600 |
| 7AAA | Ta(NMe$_2$)$_5$ (<0.75) | EDMIn/PH$_3$ | InP | 650 |
| 7BBB | tBuN=Ta(NEtMe)$_3$ (<1) | DIPMeIn/TESb | InSb | 450 |
| 7CCC | TiCl4 (<0.25) | TEG/TMI/PH$_3$ | GaInP | 625 |
| 7DDD | Ti(NEtMe)$_4$ <0.25) | TMA/TMI/TEG/TBP | AlInGaP | 700 |
| 7EEE | (iPrCp)$_2$WH$_2$ (<2) | TMG/NH$_3$ | GaN | 1000 |
| 7FFF | VCp$_2$ (<1) | TIPAl/AsH$_3$ | AlAs | 725 |
| 7GGG | V(EtCp)$_2$ (<1) | TMA/TMI/TEG/NH$_3$ | AlInGaN | 950 |
| 7HHH | Y(nBuCp)$_3$ <1) | TMG/NH$_3$ | GaN | 1050 |
| 7III | Zr(NMeEt)$_4$ (<1.5) | TEG/MEAs/BPE | GaAsP | 650 |
| 7JJJ | Zr(NMe$_2$)$_4$ (<1.25) | TEAl/TMG/TBP | AlGaP | 700 |

In the above table, the following abbreviations are used for compounds and ligands: BPE=Bisphosphino ethane, DIPMeIn=Di-isopropyl methyl indium, DMHy=Unsymmetrical Dimethylhydrazine, EDMIn=ethyl dimethyl indium, MEAs=Monoethyl arsine, MIPAs=Mono-isopropyl arsine, MPA=methylpyrrolidone alane; TBA=tertiarybutyl arsine, TBP=tertiarybutyl phosphine, TEAl=triethylaluminum, TEG=Triethylgallium, TEIn=triethyl indium, TESb=triethyl antimony, TIPAl=tri-isopropyl aluminum, TIPIn=tri-isopropyl indium, TIPSb=tri-isoproyl antimony, TMA=trimethylaluminum, TMG=trimethylgallium, TMI=trimethylindium, TMSb=trimethyl antimony, VTES=vinyl triethyl silane; acac=acetyl acetonate; hfacac=hexafluoro acetyl acetonate; and TMHD=tetramethyl heptane dionato.

What is claimed is:

1. A method of depositing a film comprising a Group IIIA metal on a substrate comprising the steps of: a) conveying a Group IIIA metal compound of formula I, R$_3$M, where M is a Group IIIA metal and each R is independently a (C$_1$-C$_{10}$) organic radical or hydrogen, in a gaseous phase to a deposition chamber containing the substrate; b) conveying a catalytic amount of a catalyst compound in a gaseous phase to the deposition chamber containing the substrate, wherein the catalyst compound is chosen from hydrazine, hydrazoic acid, diethyl beryllium, n-butyl lithium, bis(n-butyl)magnesium secondary arsines and tertiary arsines; c) conveying one or more of ammonia, phosphine and arsine in a gaseous phase to the deposition chamber containing the substrate; d) decomposing the Group IIIA metal compound and the one or more of ammonia, phosphine and arsine in the deposition chamber; and e) depositing the film comprising the Group IIIA metal on the substrate and wherein the catalyst compound is chosen from hydrazine, hydrazoic acid, diethyl beryllium, n-butyl lithium, bis(n-butyl)magnesium, bis(ethylcyclopentadienyl) nickel, titanium tetrachloride, RuCp$_2$, Mo(EtBz)$_2$, CoCp$_2$, Ba(nPrMe$_4$Cp)$_2$, Ca(Me$_5$Cp)$_2$, Cu(TMHD)$_2$, CrCp$_2$, ErCp$_3$, FeCp$_2$, Me$_2$Au(acac), LaCp$_3$, MnCp$_2$, MoCp$_2$, OsCp$_2$, Me$_3$Pd(MeCp), Me$_3$Pt(MeCp), Rh(acac)$_2$, (hfacac) AgVTES, Sr(nPrMe$_4$Cp)$_2$, Sr(hfacac), (iPrCp)$_2$WH$_2$, VCp$_2$, V(EtCp)$_2$, Y(nBuCp)$_3$, InCp, In(Me5Cp), nitrogen-containing compound, phosphorus-containing compound, arsine-containing compound, and a compound of formula II, R$^1{}_a$MY$_b$, wherein M is a Group IIIA metal, each R$^1$ is independently chosen from (C$_1$-C$_{10}$) organic radical and hydrogen, each Y is independently chosen from a halogen and hydrogen, a is an integer from 0 to 2, b is an integer from 1-3, and a+b=3; wherein the nitrogen containing compound is chosen from primary amines, secondary amines and tertiary amines; wherein the phosphorus-containing compound is chosen from primary phosphines, secondary phosphines and tertiary phosphines; and wherein the arsenic-containing compound is chosen from primary arsines, secondary arsines and tertiary arsines.

2. The method of claim 1 wherein the catalyst compound is present in an amount of ≦5 mol %, based on the moles of the Group IIIA metal compound.

3. The method of claim 2 wherein the catalyst compound is present in an amount of at least 5 ppm, based on the weight of the Group IIIA metal compound.

4. The method of claim 1 wherein the Group IIIA metal compound and the catalyst compound are conveyed from a single vapor delivery device.

5. The method of claim 1 wherein each R in formula I is independently $(C_1-C_6)$alkyl and M in formula I is chosen from indium, gallium and aluminum.

6. The method of claim 1 wherein the nitrogen-containing compound is chosen from unsymmertrical dimethyl hydrazine, phenyl hydrazine, isobutyl hydrazine, di-isopropyl amine, tBuNH2, tris(dimethylamino)gallium, tetrakis(dimethylamino)molybdenum, $AlH_3$-$NMe_3$, pentakis(dimethylamino)tantalum, tetrakis(ethylmethylamino)zirconium, $Al(NMe_2)_3$, MPA, $As(NMe_2)_3$, $B(NMe_2)_3$, $B_2(NMe_2)_4$, $Cr(NEt_2)_4$, $Hf(NMe_2)_4$, $P(NMe_2)_3$, $Ti(NEtMe)_4$, and t-BuN=$Ta(NEtMe)_3$.

7. The method of claim 1 wherein the phosphorus-containing compound is chosen from phosphorus trichloride, methyl phosphorus dichloride, phenyl phosphorus dichloride, phosphorus tribromide, methyl phosphorus dibromide, tertiarybutyl phosphine, bisphosphinoethane, $PEt_3$, and $Ni(PF_3)_4$.

8. The method of claim 1 wherein the arsenic-containing compound is chosen from arsenic trichloride, methyl arsenic dichloride, methyl arsenic dibromide, ethyl arsenic dichloride, propyl arsenic dibromide, monoethyl arsine, diethyl arsine, tertiarybutyl arsine and $AsMe_3$.

9. The method of claim 1 wherein the film comprising the Group IIIA metal is a III/V compound semiconductor film.

* * * * *